(12) United States Patent
Chen et al.

(10) Patent No.: US 12,417,955 B2
(45) Date of Patent: Sep. 16, 2025

(54) THERMAL SENSOR DEVICE BY BACK END OF LINE METAL RESISTOR

(71) Applicant: Taiwan Semiconductor Manufacturing Company, Ltd., Hsin-Chu (TW)

(72) Inventors: Yu-Hsiang Chen, Hsinchu (TW);
Hsiu-Wen Hsueh, Taichung (TW);
Szu-Lin Liu, Hsinchu (TW);
Wen-Sheh Huang, Hsin Chu (TW);
Chloe Hsin-Yi Chen, Hsinchu (TW);
Wei-Lin Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 407 days.

(21) Appl. No.: 18/156,779

(22) Filed: Jan. 19, 2023

(65) Prior Publication Data
US 2024/0249991 A1    Jul. 25, 2024

(51) Int. Cl.
*H01L 23/34* (2006.01)
*H01L 23/522* (2006.01)
*H01L 23/528* (2006.01)

(52) U.S. Cl.
CPC .......... *H01L 23/34* (2013.01); *H01L 23/5226* (2013.01); *H01L 23/5228* (2013.01); *H01L 23/5283* (2013.01)

(58) Field of Classification Search
CPC . H01L 23/34; H01L 23/5226; H01L 23/5228; H01L 23/5283; H01L 22/10–14;
(Continued)

(56) References Cited

U.S. PATENT DOCUMENTS

2005/0238080 A1\* 10/2005 Wolkin ................ G01N 25/482
374/E7.034
2013/0082345 A1     4/2013 Corcos et al.
(Continued)

FOREIGN PATENT DOCUMENTS

TW          201911611 A       3/2019
TW          201930838 A       8/2019
TW          201939003 A       10/2019

*Primary Examiner* — Shahed Ahmed
(74) *Attorney, Agent, or Firm* — HAYNES AND BOONE, LLP

(57) ABSTRACT

A semiconductor structure includes a substrate having a front side and a back side, one or more dielectric layers over the front side, and a conductive structure. The one or more dielectric layers include a thermal sensor region and two dummy regions sandwiching the thermal sensor region along a second direction from a top view. The thermal sensor region and the two dummy regions extend longitudinally along a first direction generally perpendicular to the second direction from the top view. The conductive structure is embedded in the thermal sensor region of the one or more dielectric layers. The conductive structure includes conductive lines parallel to each other and extending longitudinally along the first direction, and conductive bars and vias electrically connecting the conductive lines. The conductive lines in a same dielectric layer of the one or more dielectric layers are electrically connected one by one zigzaggedly from the top view.

20 Claims, 12 Drawing Sheets

(58) Field of Classification Search
CPC ......... H01L 22/20–26; H01L 22/30–34; H10F 77/60; H10F 77/63–68; G01R 31/265–275; H10K 59/88
See application file for complete search history.

(56) References Cited

U.S. PATENT DOCUMENTS

| | | | |
|---|---|---|---|
| 2016/0290873 A1* | 10/2016 | Horng | G01R 31/2874 |
| 2017/0160248 A1* | 6/2017 | Roizin | G01N 27/74 |
| 2022/0390293 A1 | 12/2022 | Nagai et al. | |
| 2023/0124189 A1* | 4/2023 | Lee | G01J 5/045 |
| | | | 250/330 |

* cited by examiner

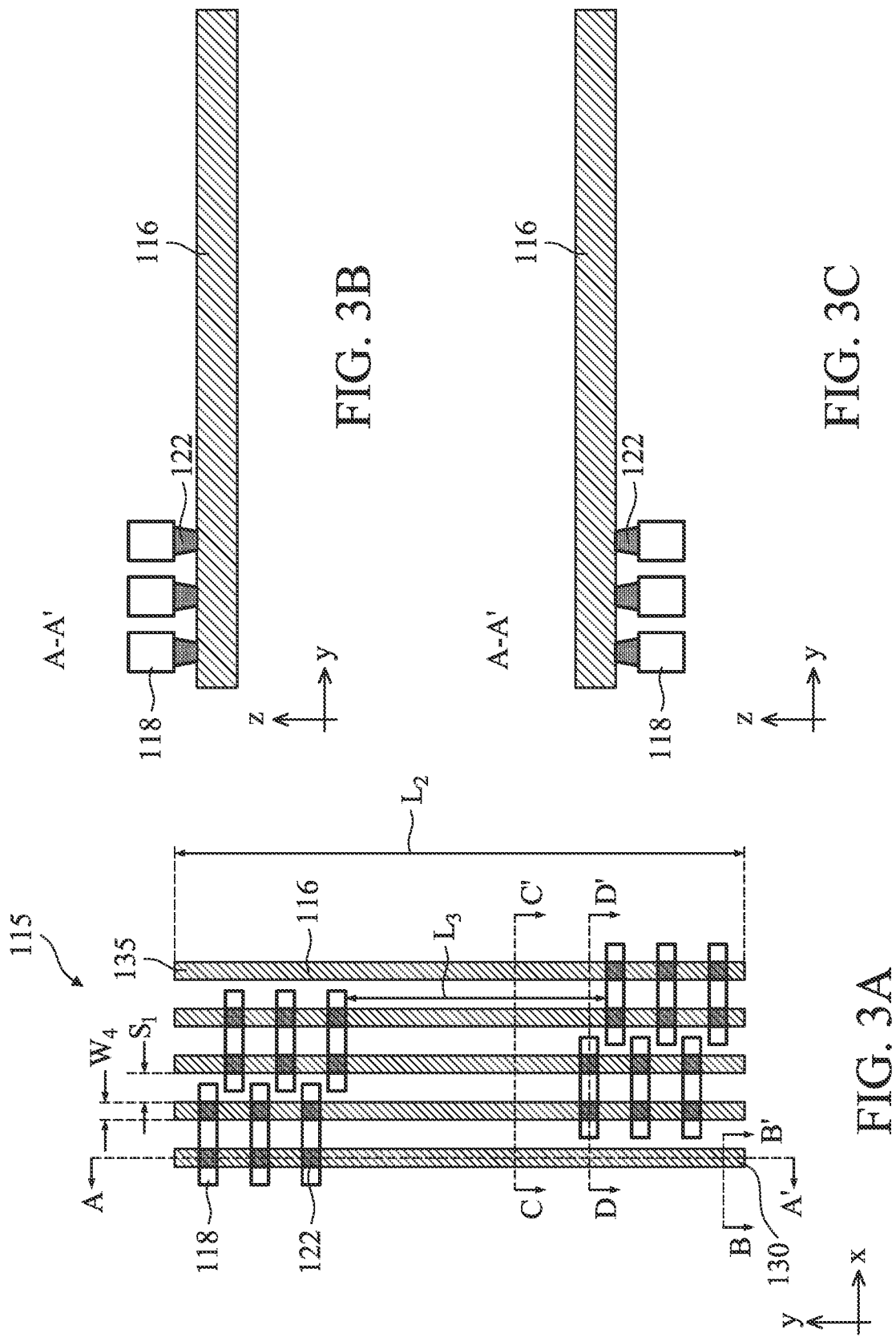

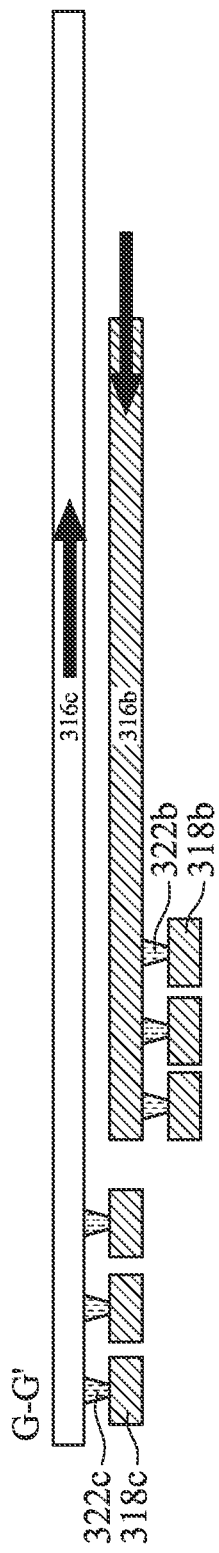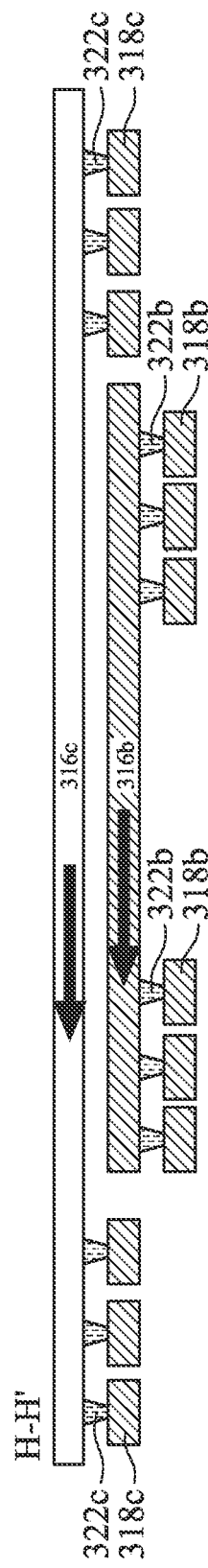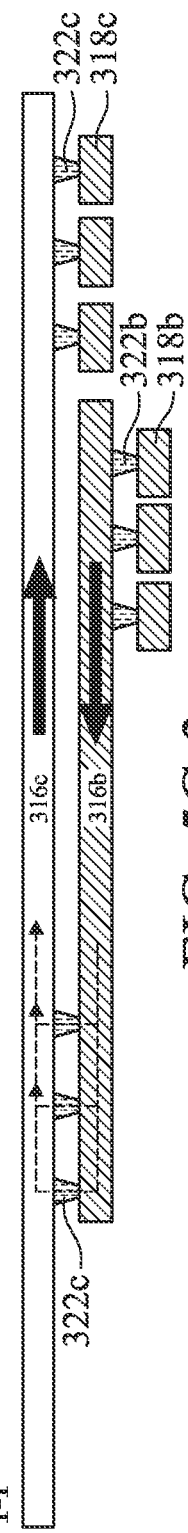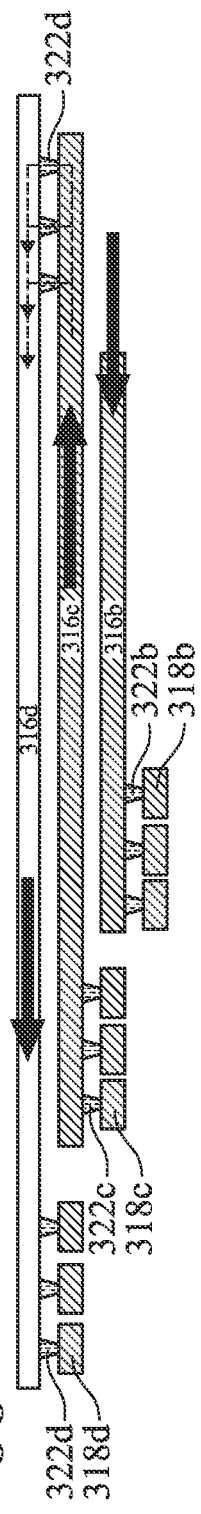
FIG. 5C-1   FIG. 5C-2   FIG. 5C-3   FIG. 5C-4

THERMAL SENSOR DEVICE BY BACK END OF LINE METAL RESISTOR

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling has also introduced increased complexity to the semiconductor manufacturing process.

In addition, operation of ICs usually generates heat, which generally increases temperature of the ICs and may cause performance deterioration. To monitor and control heat generation, thermal sensors may be needed, especially for ICs with high device packing density. Therefore, it is desirable to have a thermal sensor that is easily manufacturable, robust, and compatible with various ICs including those having smaller and more complex circuits.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
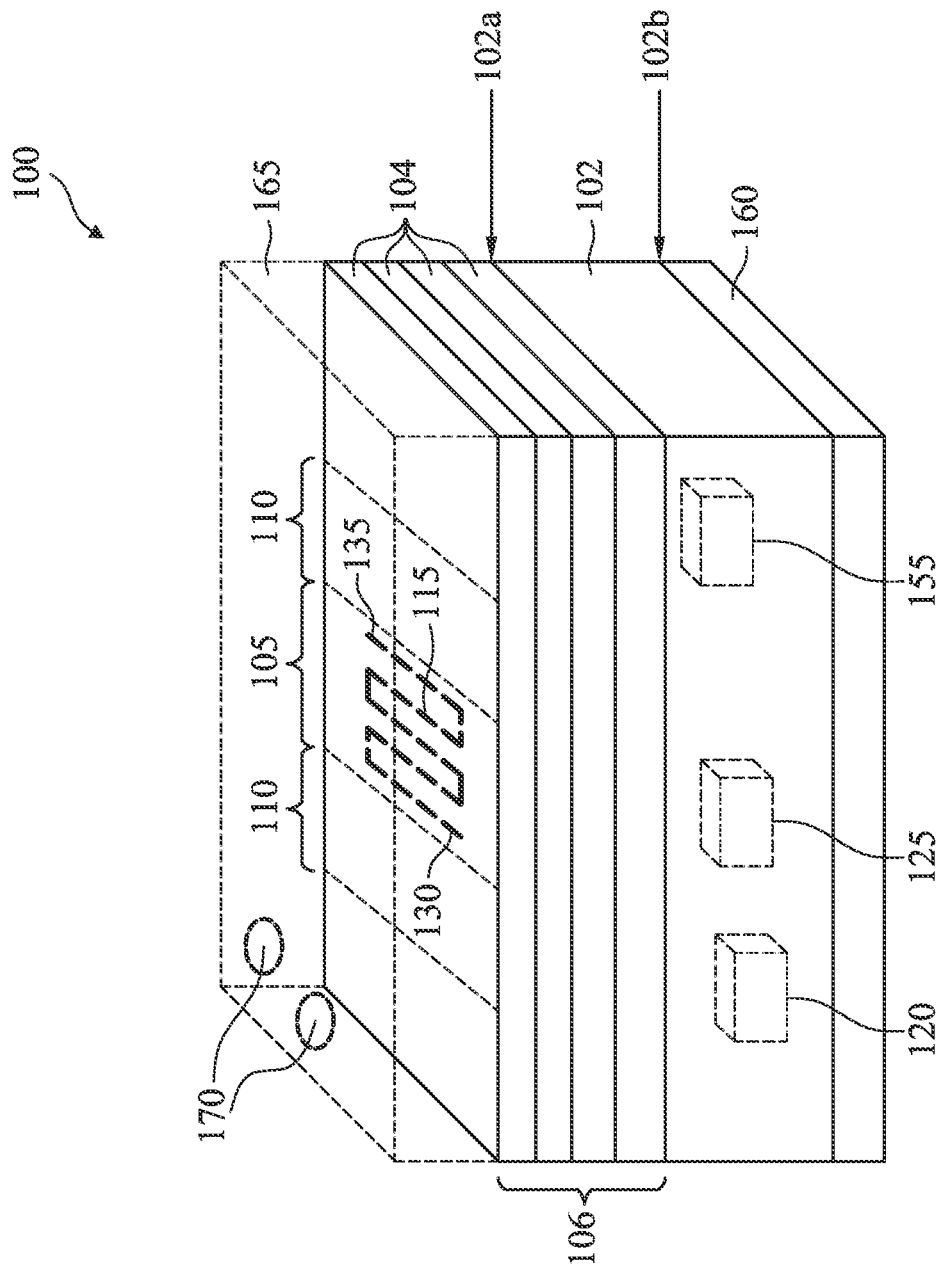
FIG. 1 is a perspective view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below." "lower." "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

The present disclosure is generally related to semiconductor devices. More particularly, it is related to semiconductor structures (such as integrated circuits (ICs)) having a thermal sensor. In some approaches, thermal sensors are implemented using bipolar junction transistors (BJTs) which are built in or on deep wells such as deep N-wells and/or deep P-wells. As transistors progress to smaller and smaller geometries in order to increase ICs' packing density, it becomes more and more difficult to incorporate deep wells in the ICs because the semiconductor layers may not be thick enough for deep wells. In some ICs, deep wells may be completely omitted. For these ICs, thermal sensors based on BJTs may not be feasible. Hence, there is a need for a new type of thermal sensors that resolve the above issues and are compatible with advanced semiconductor processes. Embodiments of the present disclosure disclose a new type of thermal sensors that are fabricated during back-end-of-line (BEOL) processes and use metal lines instead of BJTs. In various embodiments, the disclosed thermal sensor is robust and is compatible with IC manufacturing processes for high device packing density. The thermal sensor can be used to measure temperatures (e.g., operating temperatures) of a device, such as a central processing unit (CPU), a graphics processing unit (GPU), or the like.

FIG. 1 is a perspective view of a semiconductor structure 100 constructed according to various aspects of the present disclosure. Referring to FIG. 1, the semiconductor structure 100 includes a substrate 102 having a front side 102a and a back side 102b opposite to the front side 102a. In embodiments, the semiconductor structure 100 includes an interconnect layer 106 formed over the front side 102a of the substrate 102. In some embodiments, the semiconductor structure 100 includes a passivation layer 165 over the interconnect layer 106. In some embodiments, the semiconductor structure 100 includes a backside interconnect layer 160 over the back side 102b of the substrate 102.

In embodiments, the substrate 102 includes a silicon substrate (e.g., a silicon wafer). Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 includes a semiconductor on insulator (SOI) substrate. The substrate 102 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs and gate-all-around (GAA) transistors. The substrate 102 may further include passive devices such as resistors, capacitors, and inductors. In some embodiments, the substrate 102 includes one or more transistors 155 as shown in FIG. 1, which may be of any type of transistors discussed herein. In some embodiments, the substrate 102 includes a current source 120 and a voltage monitor 125. In some embodiments, the current source 120 and the voltage monitor 125 may be omitted from the substrate 102 and may be provided external to the semiconductor structure 100.

The interconnect layer 106 includes one or more dielectric layers 104. In various embodiments, the interconnect layer 106 may include any number of the dielectric layers 104, such as one, two, three, four, five, six, seven, or even more dielectric layers 104. In embodiments, the one or more dielectric layers 104 include a thermal sensor region 105 and two dummy regions 110 on two sides of the thermal sensor region 105. In the embodiment depicted in FIG. 1, the two dummy regions 110 sandwich the thermal sensor region 105 along the X-direction. In embodiments, the semiconductor structure 100 includes a conductive structure 115 (indicated by bold dashed lines in FIG. 1) embedded in the thermal sensor region 105. In an embodiment, the conductive structure 115 is in a circuit area of the semiconductor structure 100. The conductive structure 115 includes a first end 130 and a second end 135. The first end 130 and the second end 135 are separated by a portion or an entirety of the conductive structure 115. In some embodiments, the first end 130 and the second end 135 of the conductive structure 115 are electrically coupled to the current source 120 and the voltage monitor 125. The conductive structure 115 functions as a thermal sensor in the semiconductor structure 100 and may be referred to as a thermal sensor 115. Although one conductive structure 115 is shown in FIG. 1, the semiconductor structure 100 may include more than one conductive structure 115. In embodiments, each conductive structure 115 includes a first end 130 and a second end 135.

The interconnect layer 106 includes metal tracks embedded in the one or more dielectric layers 104. In an embodiment, the conductive structure 115 is part of the metal tracks. The metal tracks may be in the form of one or more metal layers, for example, metal layers $M_0$, $M_1$, $M_2$, $M_3$, $M_4$, $M_5$, $M_6$, etc. from bottom to top. The conductive structure 115 may be in any one or more of the metal layers.

The one or more dielectric layers 104 include dielectric materials. In embodiments, the dielectric materials may include a low-K dielectric material such as tetraethylorthosilicate (TEOS) formed oxide, un-doped silicate glass, or doped silicon oxide such as borophosphosilicate glass (BPSG), fluorosilicate glass (FSG), phosphosilicate glass (PSG), borosilicate glass (BSG), and/or other suitable dielectric materials.

The passivation layer 165 may be formed over the interconnect layer 106 using a suitable process such as a process including a deposition process and a chemical mechanical polishing (CMP) process. In an embodiment, the passivation layer 165 includes a dielectric material, such as silicon oxide ($SiO_2$), silicon nitride ($Si_3N_4$), silicon oxynitride (SiON), or a combination thereof, and may include one layer of a dielectric material or multiple layers of dielectric materials.

In an embodiment, the semiconductor structure 100 includes conductive pads 170 over the passivation layer 165. Two conductive pads 170 are depicted in FIG. 1, however, in some embodiments, the semiconductor structure 100 includes more than two conductive pads 170. In an embodiment, the conductive pads 170 are electrically connected to external connectors (e.g., two external connectors), which are not depicted in FIG. 1. In some embodiments, the first end 130 and the second end 135 of the conductive structure 115 are electrically coupled to the conductive pads 170, which are then electrically coupled to external connectors. In an embodiment, the conductive pads 170 include aluminum (Al) and may be referred to as aluminum (Al) pads. In alternative embodiments, the conductive pads 170 may include other conductive materials such as aluminum copper alloy (AlCu), copper (Cu), or titanium (Ti).

Figure 2:
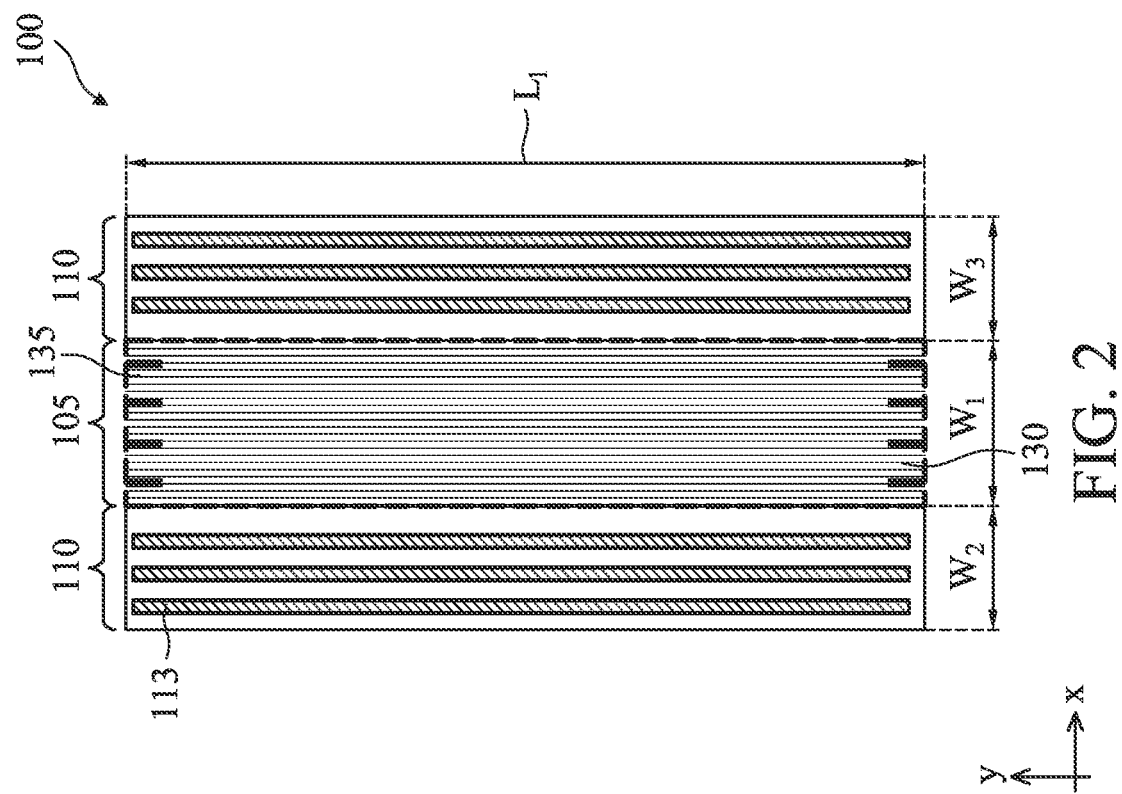
FIGS. 2, 3A, 5A, and 6 are top views of portions of the semiconductor structure of FIG. 1, in accordance with some embodiments of the present disclosure.

FIG. 2 is a top view of a portion of the semiconductor structure 100 of FIG. 1. The two dummy regions 110 and the thermal sensor region 105 extend longitudinally generally along the Y-direction perpendicular to the X-direction from the top view. The two dummy regions 110 and the thermal sensor region 105 have a length $L_1$ in the Y-direction and widths $W_2$, $W_1$, and $W_3$ in the X-direction, respectively, as shown in FIG. 2. In some embodiments, $L_1$ is about 8 μm to about 50 μm, such as about 12 μm to about 40 μm, about 25 μm to about 35 μm, or about 30 μm. If $L_1$ is too small, there may not be enough space for the conductive structure 115 and the resistance value of the conductive structure 115 may be too small to function as a thermal sensor; if $L_1$ is too large, it may unnecessarily increase the chip footprint and the costs associated therewith. In some embodiments, $W_2$ and $W_3$ each is about 0.3 μm to about 10 μm, such as about 0.5 μm to about 8 μm, about 1 μm to about 5 μm, or about 1 μm to about 3 μm. If $W_2$ or $W_3$ is too small, there may not be enough electrical and/or thermal isolation between the thermal sensor region 105 and other parts of the semiconductor structure 100, and there may not be enough space to provide similar pattern density (e.g., for purposes of CMP) on both sides of the thermal sensor region 105; if $W_2$ or $W_3$ is too large, it may unnecessarily increase the chip footprint and the costs associated therewith. In some embodiments, $W_1$ is about 0.6 μm to about 12 μm, such as about 1 μm to about 10 μm, or about 1 μm to about 7 μm. If $W_1$ is too small, there may not be enough space for the conductive structure 115 and the resistance value of the conductive structure 115 may be too small to function as a thermal sensor; if $W_1$ is too large, it may unnecessarily increase the chip footprint and the costs associated therewith. In embodiments, a ratio of a total width of $W_2$ and $W_3$ to $W_1$ (i.e., $(W_2+W_3):W_1$) is about 0.8 to about 10, such as about 0.8 to about 2, or about 0.8 to about 1.2. In some embodiments, a total width of $W_2$ and $W_3$ is about the same as $W_1$. If the ratio is too small, there may not be enough electrical and/or thermal isolation between the thermal sensor region 105 and other parts of the semiconductor structure 100, and there may not be enough space to provide similar pattern density (e.g., for purposes of CMP) on both sides of the thermal sensor region 105; if the ratio is too large, it may unnecessarily increase the chip footprint and the costs associated therewith. The first end 130 and the second end 135 of the conductive structure 115 may be at locations as shown in FIG. 2, or at other locations of the thermal sensor region 105.

In the depicted embodiment, the semiconductor structure 100 includes two dummy regions 110. The two dummy regions 110 serve to isolate (electrically and/or thermally) other parts of the semiconductor structure 100 from the thermal sensor region 105. In an embodiment, each of the two dummy regions 110 includes dummy conductive lines 113 embedded in the one or more dielectric layers 104. FIG. 2 depicts some of the dummy conductive lines 113. In embodiments, the dummy conductive lines 113 are parallel to each other and extend longitudinally along the Y-direction. In an embodiment, the dummy conductive lines 113 include the same materials as the conductive structure 115 in the thermal sensor region 105. The dummy conductive lines 113 may be similar to or different from the conductive structure 115 in terms of length, widths, spacing, shapes, routing directions, etc. In some embodiments, the dummy conductive lines 113 may or may not be connected to each other by vias or conductive bars. In an embodiment, the dummy conductive lines 113 are used to provide uniform or near uniform pattern density in the respective metal layer(s) for purposes of CMP as further described below.

In embodiments, the two dummy regions 110 and the thermal sensor region 105 create a uniform environment during various manufacturing processes, such as CMP and etching processes. For example, the two dummy regions 110 may provide a similar metal pattern density (e.g., a ratio of dummy conductive lines 113 to dielectric) compared to a metal pattern density (e.g., a ratio of conductive structure 115 to dielectric) in the thermal sensor region 105. Having such similarity in metal pattern density may help reduce or eliminate dishing effects during CMP.

Figure 3D:
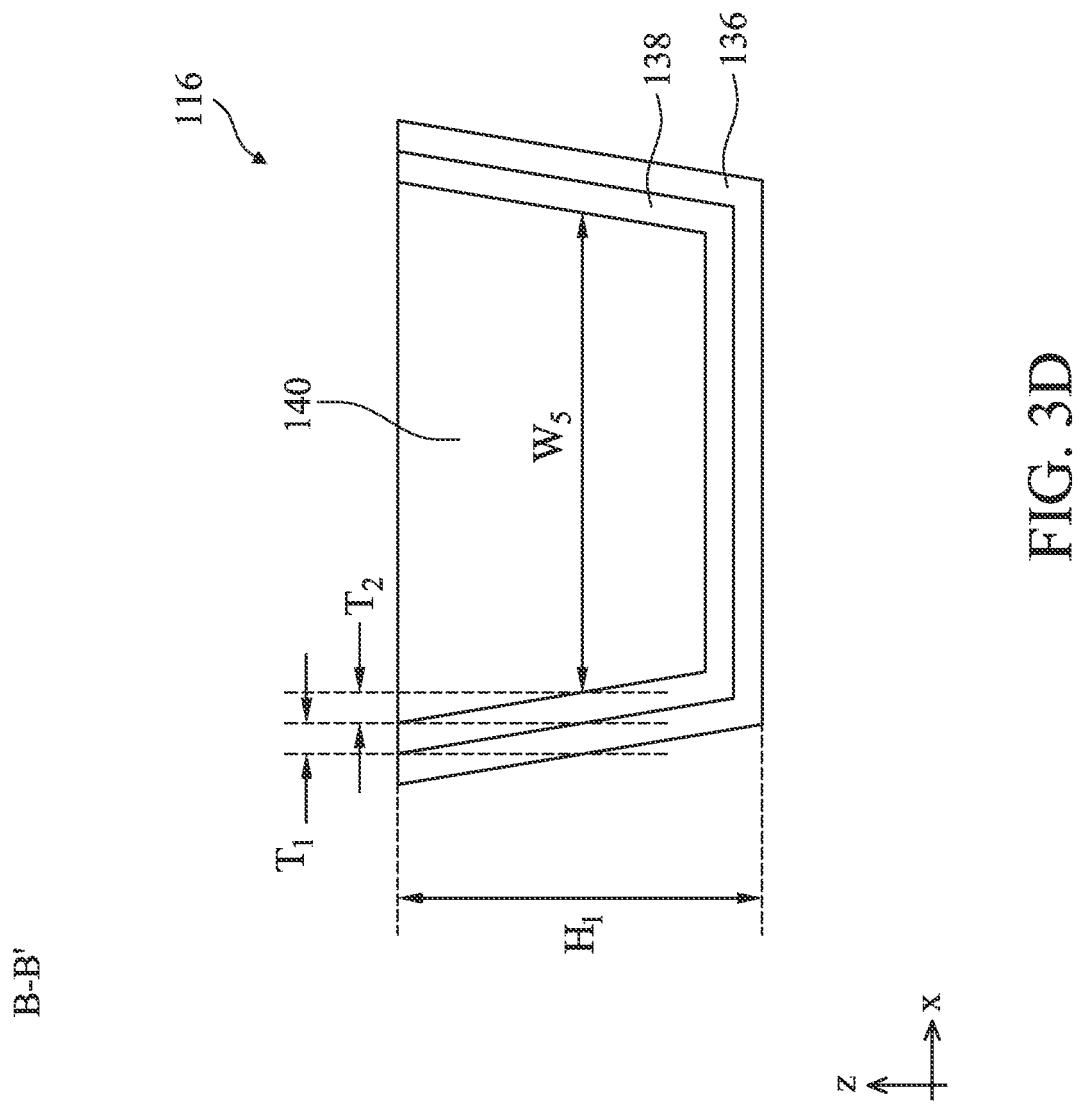
FIGS. 3B, 3C. 3D, 4A, 4B, 5C-1, 5C-2, 5C-3, 5C-4, 5D, and 5E are cross-sectional views of portions of the semiconductor structure of FIG. 1, in accordance with some embodiments of the present disclosure.

FIG. 3A is a top view of the conductive structure 115 of the semiconductor structure 100 of FIG. 1 according to some embodiments of the present disclosure. The one or more dielectric layers 104 are not shown in FIGS. 3A-3D for the purposes of simplicity, however, the conductive structure 115 is embedded in the one or more dielectric layers 104. In embodiments, the conductive structure 115 includes conductive lines 116, conductive bars 118, and vias 122. The number of the conductive lines 116 may be any suitable number, such as a number between 3 and 101, a number between 3 and 23, a number between 25 and 49, or a number between 51 and 101, including both end numbers. In the depicted embodiment, the conductive lines 116 are parallel to each other and extend longitudinally along the Y-direction. In the depicted embodiment, the conductive lines 116 are embedded in the same dielectric layer(s) 104 and the conductive structure 115 may be referred to as a single layer thermal sensor. In the present embodiment, the conductive lines 116 are electrically connected one by one zigzaggedly from a top view by the conductive bars 118 and the vias 122. In embodiments, the conductive bars 118 are parallel to each other. In embodiments, the conductive bars 118 extend longitudinally along the X-direction. Each of the conductive lines 116 includes two end portions and a middle portion between the two end portions. In embodiments, two of the conductive lines 116 are connected by multiple vias 122 and multiple conductive bars 118 (e.g., three of the conductive bars 118 and six of the vias 122) at their end portions. The number of sets of the vias 122 and conductive bars 118 connecting two of the conductive lines 116 may be any suitable numbers, such as one set (i.e., one conductive bar 118 and two vias 122), two sets, three sets, etc. In embodiments, two of the conductive lines 116 are connected by three or more sets of vias 122 and conductive bars 118 at their end portions to ensure that connections of the two conductive lines 116 can tolerate manufacturing process variations and withstand electromigration during operation of the semiconductor structure 100.

In embodiments, the conductive lines 116 have a width $W_4$ in the X-direction. The width $W_4$ is in a range of about 10 nm to about 250 nm, such as about 18 nm to about 200 nm, about 18 nm to about 100 nm, or about 36 nm to about 60 nm. In an embodiment, the width $W_4$ is designed to be at least twice of the minimum conductor line width in the respective interconnect layer. If $W_4$ is too small, variation of temperature coefficients of the resistance of the thermal sensor 115 may be increased, which may reduce accuracy of temperature measurement by the thermal sensor 115; if $W_4$ is too large, the resistance value of the thermal sensor 115 may be too small to function as a thermal sensor, and the chip footprint and the costs associated therewith may be unnecessarily increased. In embodiments, a spacing $S_1$ between two adjacent conductive lines 116 in the X-direction is about 10 nm to about 160 nm, such as between 20 nm and 140 nm, between 25 nm and 125 nm, between 30 nm and 110 nm, or between 30 nm and 100 nm. If $S_1$ is too small, there may not be enough electrical and/or thermal isolation between adjacent conductive lines 116; if $S_1$ is too large, it may unnecessarily increase the chip footprint and the costs associated therewith. In some embodiments, a ratio of $W_4$ to $S_1$ is about 0.2 to about 5, such as about 0.2 to about 3.5, about 0.3 to about 2, and about 0.3 to about 1.2. If the ratio is too small, it may unnecessarily increase the chip footprint and the costs associated therewith; if the ratio is too large, there may not be enough electrical and/or thermal isolation between adjacent conductive lines 116.

In embodiments, each of the conductive lines 116 has a length $L_2$ along the Y-direction, where $L_2$ is about 8 μm to about 50 μm, such as 20 μm to about 40 μm, about 25 μm to about 35 μm. If $L_2$ is too small, the resistance value of the conductive structure 115 may be too small to function as a thermal sensor; if $L_2$ is too large, it may unnecessarily increase the chip footprint and the costs associated therewith. A conductive bar 118 connected to an end portion of a conductive line 116 may be spaced apart from another conductive bar 118 connected to the other end portion of the conductive line 116 by a length $L_3$ along the Y-direction. The length $L_3$ may be less than $L_2$ by about 0.1% to about 20% in some embodiments.

FIGS. 3B and 3C are two alternative partial, cross-sectional views of the semiconductor structure 100 along the A-A' line of FIG. 3A. In the embodiment depicted in FIG. 3B, all of the conductive bars 118 and the vias 122 are above the conductive line 116. In the embodiment depicted in FIG. 3C, all of the conductive bars 118 and the vias 122 are below the conductive line 116. In some other embodiments (not shown), some conductive bars 118 and vias 122 connecting to a same conductive line 116 are above the conductive line 116, while other conductive bars 118 and vias 122 connecting to the same conductive line 116 are below the conductive line 116. The conductive bars 118 and the vias 122 connecting to a conductive line 116 may be in a same or a different dielectric layer 104 than the dielectric layer 104 that the conductive line 116 is embedded in.

FIG. 3D is a partial, cross-sectional view of the semiconductor structure 100 along the B-B' line of FIG. 3A. In embodiments, each of the conductive lines 116 includes a barrier layer 136 as an outer layer in direct contact with the one or more dielectric layers 104, and a metal layer 140 as an inner layer over the barrier layer 136. In embodiments, the barrier layer 136 interposes between sidewalls and a bottom surface of the metal layer 140 and the one or more dielectric layers 104 as depicted in FIG. 3D. In some embodiments, the conductive lines 116 further includes a second barrier layer 138 between the barrier layer 136 and the metal layer 140.

The barrier layer 136 may prevent the metal material of the metal layer 140 from diffusing into the one or more dielectric layers 104. The barrier layer 136 may also increase the adhesion between the metal layer 140 and the dielectric layer(s) 104. The barrier layer 136 may include a metal or metal nitride, such as tantalum (Ta), tantalum nitride (TaN), titanium nitride (TiN), ruthenium (Ru), or a combination thereof. In an embodiment, the barrier layer 136 includes TaN. The metal layer 140 may comprise copper (Cu), manganese (Mn), aluminum copper (CuAl), copper magnesium (CuMn), aluminum (Al), tungsten (W), cobalt (Co), silver (Ag), gold (Au), other suitable metals, or a combination thereof. In embodiments, the metal layer 140 comprises Cu. In some embodiments, the second barrier layer 138 includes Co.

In embodiments, the conductive lines 116 have a height $H_1$ of about 8 nm to about 250 nm. In some embodiments, at about half of the height $H_1$ of the conductive lines 116, the metal layer 140 has a width $W_5$ in the X-direction, the barrier layer 136 has a thickness $T_1$ in the X-direction, and the second barrier layer 138 has a thickness $T_2$ in the X-direction. A total of $W_5$, $T_1$, and $T_2$ is about the same as $W_4$ in FIG. 3A. In embodiments, $T_1$ and $T_2$ are each about 0.5 nm to about 5 nm, $W_5$ is about 10 nm to about 250 nm. In embodiments, in the cross-sectional view, a ratio of the area of the metal layer 140 to the area of the barrier layer 136 is about 10 to about 30,000, such as about 10 to about 1,000, about 10 to about 800, or about 20 to about 500. If the ratio is too small, variation of temperature coefficients of the resistance of the thermal sensor 115 may be increased, which may reduce accuracy of temperature measurement by the thermal sensor 115. If the ratio is too large, it may unnecessarily increase the chip footprint and the costs associated therewith.

Similarly, the conductive bars 118 and the vias 122 may each include one or more barrier layers as an outer layer and a metal layer as an inner layer. The barrier layer(s) and the metal layer of the conductive bars 118 and the vias 122 may include similar or same materials as the materials in the conductive lines 116.

Figure 4A:
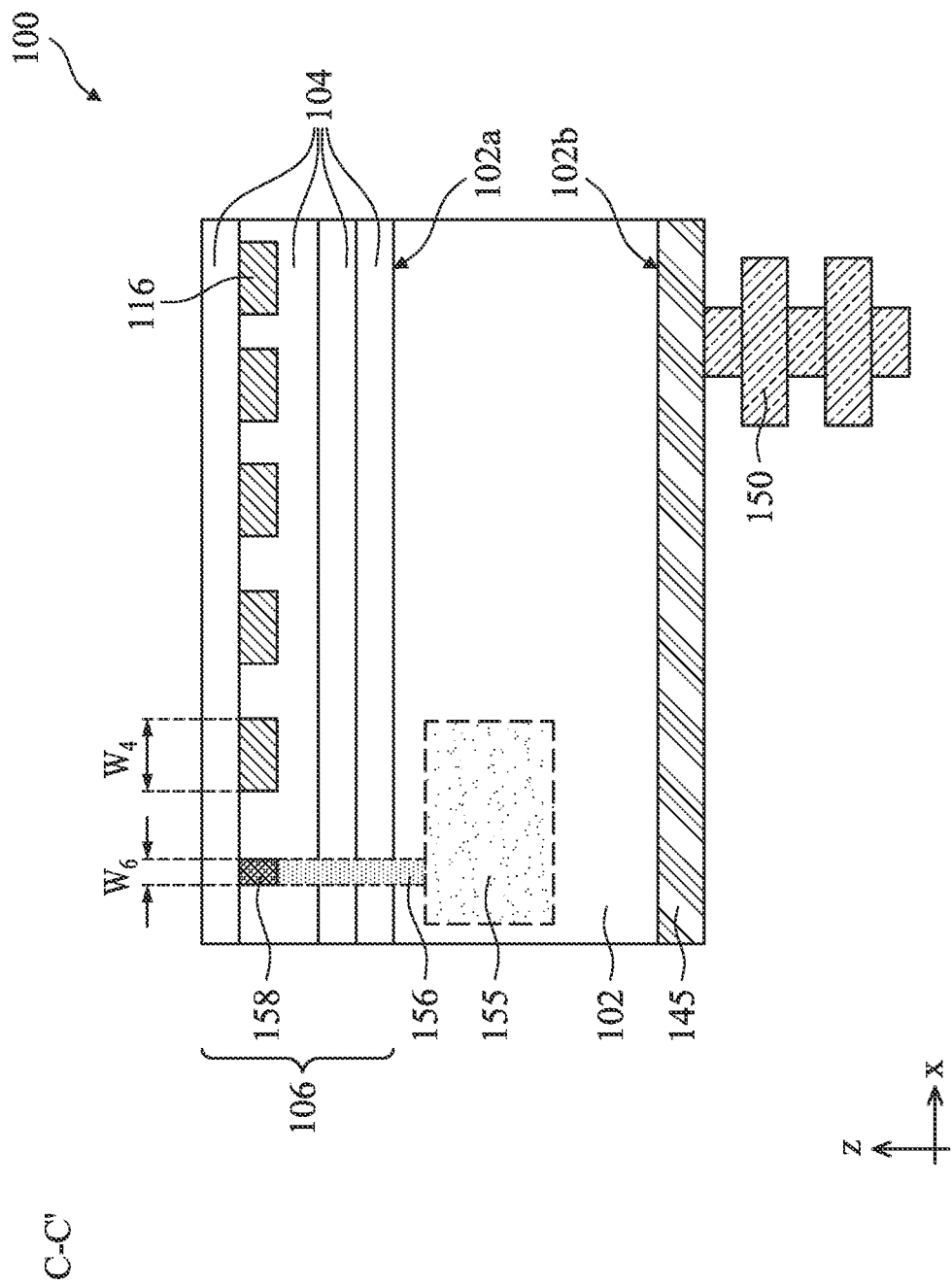

FIG. 4A is a partial, cross-sectional view of the semiconductor structure 100 along the C-C' line of FIG. 3A. In some embodiments, the semiconductor structure 100 includes an interconnect metal line 158 embedded in a dielectric layer 104 where the conductive lines 116 are embedded. The substrate 102 includes the one or more transistors 155, details of which are omitted in FIG. 4A. The interconnect metal line 158 may be coupled to the one or more transistors 155 by an interconnect via 156. The one or more transistors 155 and the interconnect via 156 are shown in dashed lines, because they may be in a difference cross section than shown in FIG. 4A. The interconnect metal line 158 may be any one of the metal tracks (e.g., in $M_0$, $M_1$, $M_2$ metal layers, etc.) available in the semiconductor structure 100 for directly connecting to the one or more transistors 155. In embodiments, the conductive lines 116 and the interconnect metal line 158 are in the same metal layer, such as $M_3$ layer or $M_4$ layer. The interconnect metal line 158 may have a width $W_6$ in the X-direction. The conductive lines 116 each may have the width $W_4$. In embodiments, $W_4$ is about 2 to about 3 times of $W_6$. If a ratio of $W_4$ to $W_6$ is too small (e.g., $W_4$ is the same as $W_6$), variation of temperature coefficients of the resistance of the thermal sensor 115 may be increased, which may reduce accuracy of temperature measurement by the thermal sensor 115; if a ratio of $W_4$ to $W_6$ is too large (e.g., $W_4$ is 5 times of $W_6$), the resistance value of the thermal sensor 115 may be too small to function as a thermal sensor, and the chip footprint and the costs associated therewith may be unnecessarily increased.

In some embodiments, the semiconductor structure 100 includes a backside power rail 145 over the back side 102b of the substrate 102. In some embodiments, the semiconductor structure 100 includes a backside interconnect 150. A backside via may be electrically connected between the backside power rail 145 and the one or more transistors 155 in the substrate 102. In an embodiment, the backside power rail 145 may be formed using a damascene process, a dual-damascene process, a metal patterning process, or other suitable processes. The backside power rail 145 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIGS. 4A and 4B, the backside power rail 145 is embedded in one or more dielectric layers, and the backside interconnect 150 includes wires and vias embedded in one or more dielectric layers. In some embodiment, the backside power rail 145 is considered part of the backside interconnect 150. The backside interconnect layer 160 shown in FIG. 1 includes the one or more dielectric layers, the backside interconnect 150, and the backside power rail 145. Having the backside power rail 145 beneficially increases the number of metal tracks available in the semiconductor structure 100 for directly connecting to the one or more transistors 155. The backside power rail 145 may have wider dimension than the lower level metal tracks (e.g., $M_0$ or $M_1$) on the frontside of the semiconductor structure 100, which beneficially reduces the backside power rail's resistance.

Figure 4B:
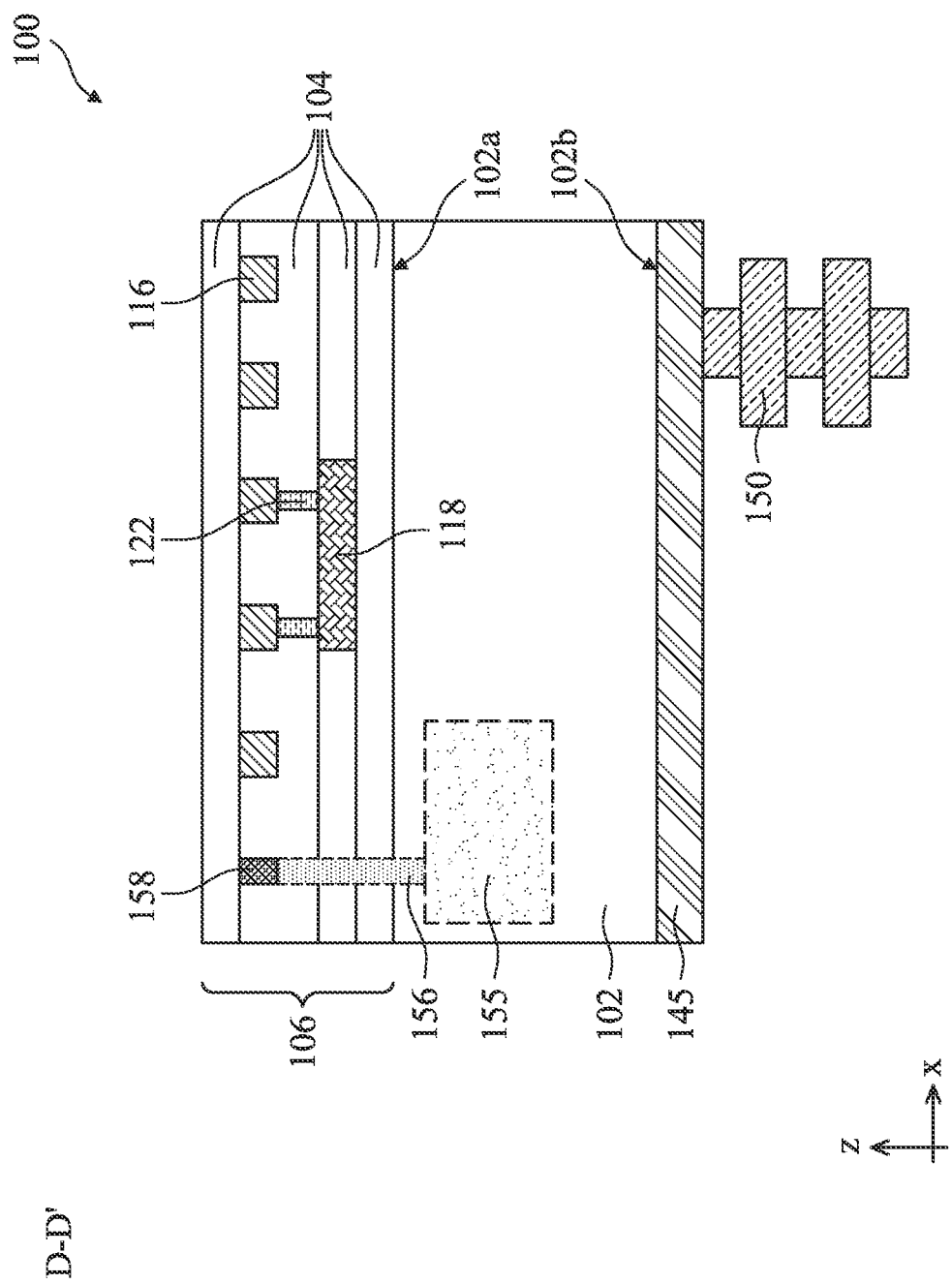

FIG. 4B is a partial, cross-sectional view of the semiconductor structure 100 along the D-D' line of FIG. 3A. As shown in FIG. 4B, two adjacent conductive lines 116 are connected by the vias 122 and the conductive bars 118. In embodiments, the conductive bars 118 are in a different dielectric layer 104 above or below the two adjacent conductive lines 116 as discussed with reference to FIGS. 3B and 3C.

In some embodiments, referring to FIG. 1, the first end 130 and the second end 135 of the conductive structure 115 are electrically coupled to the current source 120 and the voltage monitor 125. A current I and a voltage V across the first end 130 and the second end 135 of the conductive structure 115 may be obtained during operation of the semiconductor structure 100. At a temperature T, a resistance R between the first end 130 and the second end 135 of the conductive structure 115 may be calculated by R=V/I. At a reference temperature T0, a resistance between the first end 130 and the second end 135 of the conductive structure 115 is a reference resistance $R_{T0}$, which may be obtained during fabrication or during operation of the semiconductor structure 100. T and T0 may be between −60 degree Celsius (C) and 150° C. In some embodiments, T0 is 25° C. In some embodiments, $R_{T0}$ at about 25° C. is in a range from about 10,000 ohm to about 20,000 ohm.

In some embodiments, $R/R_{T0}$ is approximately equal to $(1+TC1*(T-T0)+TC2*(T-T0)^2)$, where TC1 is a first order temperature coefficient and TC2 is a second order temperature coefficient. For a conductive structure 115 and T0, TC1 and TC2 are constants and may be obtained during fabrication or during operation of the semiconductor structure 100. TC1 may be equal to or greater than about 0.001 (1/° C.). In embodiments, TC1 is in a range of about 0.001 (1/° C.) to about 0.005 (1/° C.), such as about 0.001 (1/° C.) to about 0.004 (1/° C.), about 0.001 (1/° C.) to about 0.003 (1/° C.), about 0.001 (1/° C.) to about 0.002 (1/° C.), about 0.0016) (1/° ° C., to about 0.0018)(1/° ° C. In embodiments, for different conductive structures 115 and a same T0, TC1 increases as $R_{T0}$ decreases. In embodiments, TC1 is about a linear function of $R_{T0}$.

For a conductive structure 115 and a T0, TC1 and TC2 may be obtained from multiple sets of measured resistances at known temperatures. Similarly, multiple TC1 may be obtained for multiple conductive structures 115 (e.g., having conductive lines, conductive bars, and vias with the same dimensions and materials). These TC1 have a mean TC1 and a variation of 1σ. In some embodiments, 1σ/mean of TC1 for conductive structure 115 of the present embodiment is less than about 3%, such as less than about 2%, or less than about 1%. In embodiments, 1σ/mean of TC1 decreases as TC1 increases.

In embodiments, during operation of the semiconductor structure 100, temperature T is calculated from the following equation (1), in which R, $R_{T0}$, TC1, TC2, and T0 are known, and R is calculated from known V and I (e.g., obtained or measured by the current source 120 and the voltage monitor 125).

$$R/R_{T0} = 1 + TC1*(T - T0) + TC2*(T - T0)^2 \quad (1)$$

Figure 5A:
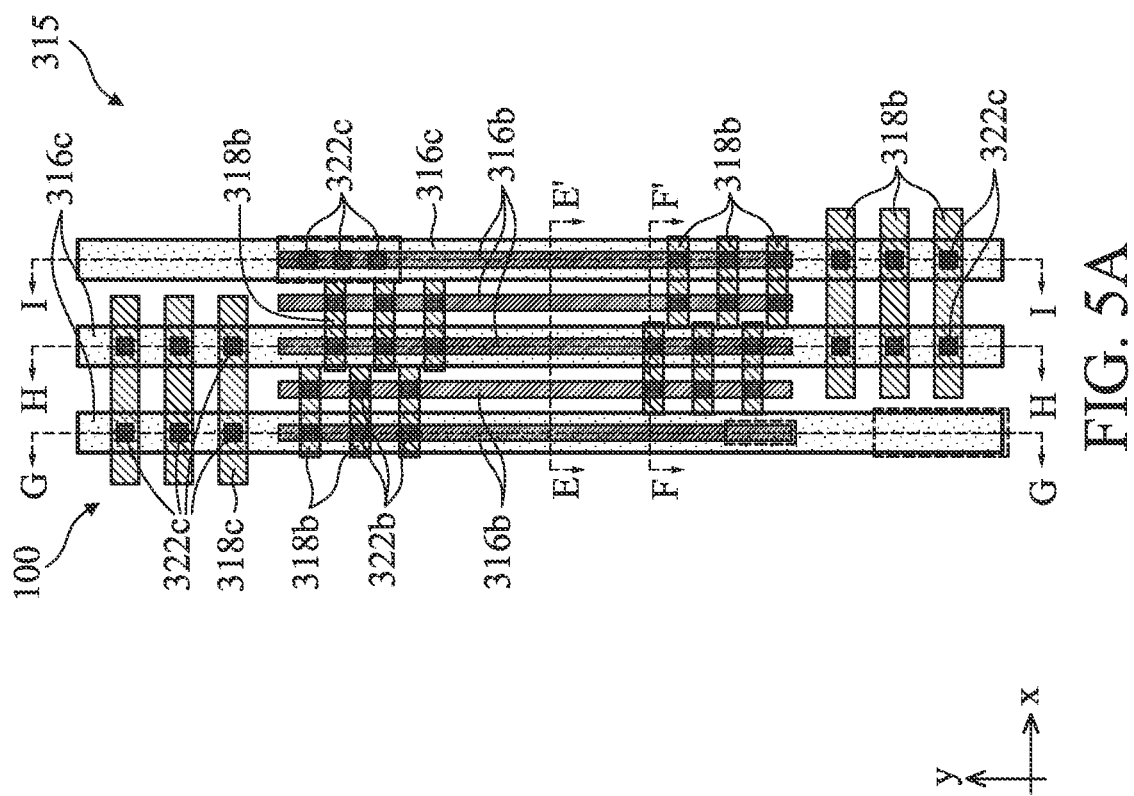
Figure 5B:
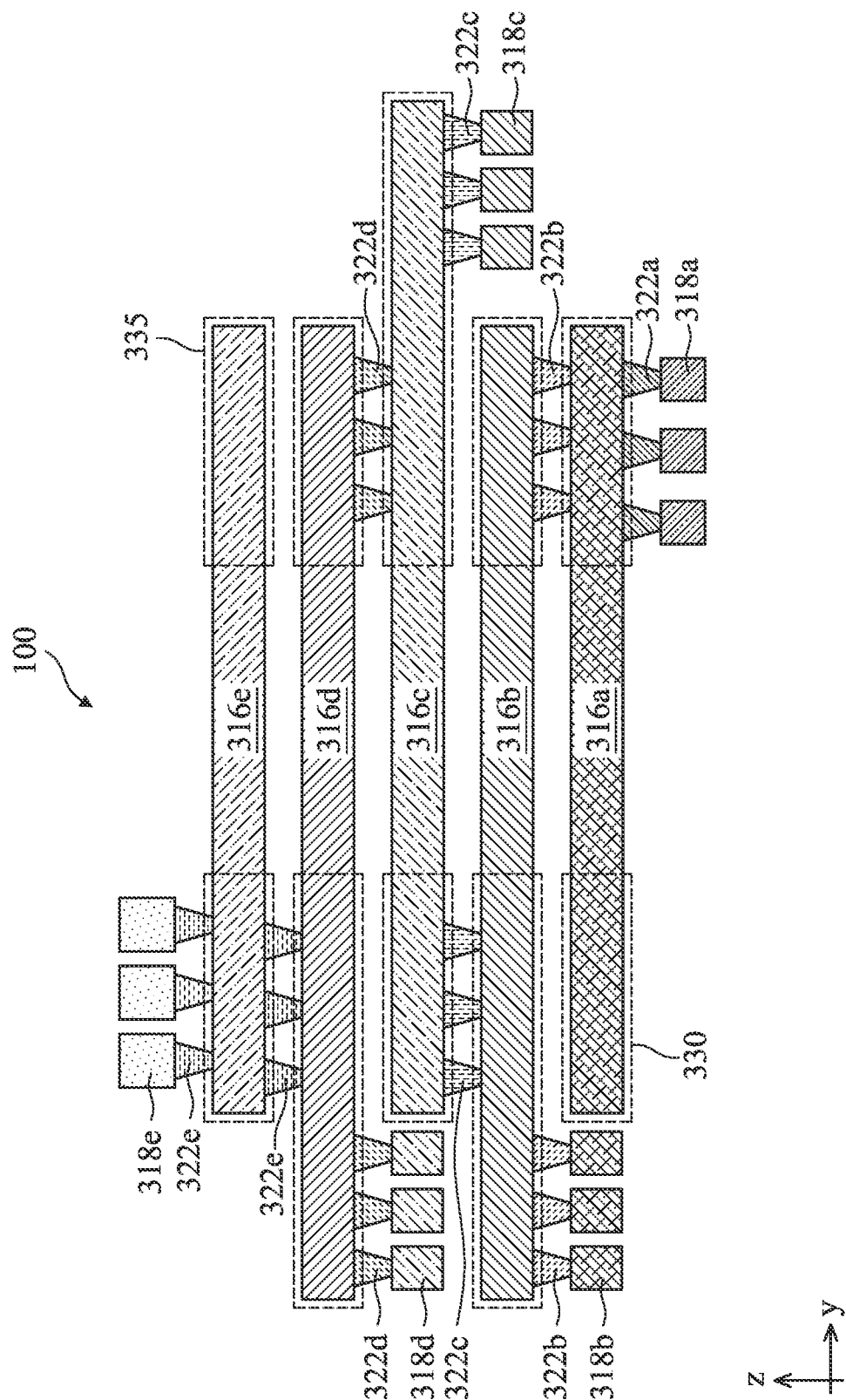
FIG. 5B is a schematic side view of portions of the semiconductor structure of FIG. 1, in accordance with some embodiments of the present disclosure.

Referring to FIGS. 5A-5E, in some embodiments, the semiconductor structure 100 includes a conductive structure 315 having multiple layers of conductive lines embedded in the thermal sensor region 105. The conductive structure 315 may be referred to as a multi-layer thermal sensor 315. In embodiments, the conductive structure 315 further includes multiple layers of conductive bars and vias. FIGS. 5A and 5C-5E are a top view and cross-sectional views of portions of the semiconductor structure 100 of FIG. 1 with multiple layers of conductive lines, respectively, according to some embodiments. FIG. 5B is a schematic side view of portions of the semiconductor structure 100 of FIG. 1 according to an embodiment.

In some embodiments, the conductive structure 315 includes five layers of conductive lines 316a-316e, conductive bars 318a-318c, and vias 322a-322e embedded in different dielectric layers 104 (not shown in FIGS. 5A-5B for the purposes of simplicity). The number of the conductive lines 316a-316e in each layer may be any suitable number, such as a number between 3 and 101, a number between 3 and 23, a number between 25 and 49, or a number between 51 and 101, inclusive of the end numbers. In embodiments, the conductive lines 316a-316e are in different metal layers (e.g., $M_0$, $M_1$, $M_2$, $M_3$, etc.). Different layers of the conductive structure 315 may include a same number or different numbers of the conductive lines. For the purposes of simplicity, FIG. 5A only shows two layers of the conductive lines—the conductive lines 316b-316c, as well as the conductive bars 318b-318c and vias 322b-322c associated with the conductive lines 316b-316c. However, more layers of the conductive lines and more layers of conductive bars and vias may be included in the conductive structure 315. Referring to FIG. 5A, for the purposes of simplicity, overlapped portions are shown in solid lines, even though a portion is under another portion and may not be seen from the top view (e.g., the conductive line 316b on the left is under the conductive line 316c on the left). In the present embodiment, the conductive lines 316a-316e in different layers are parallel to each other and extend longitudinally along the Y-direction, and the conductive bars 318a-318e are parallel to each other and extend longitudinally along the X-direction. Stacking of the parallel conductive lines as shown in FIG. 5A may reduce chip footprint and the costs associated therewith.

Similar to the conductive lines 116 in FIG. 3A, each of the conductive lines 316a-316e includes two end portions and a middle portion between the two end portions. The conductive lines in a same dielectric layer 104 (e.g., the conductive lines 316b) are connected to each other by the conductive bars (e.g., conductive bars 318b) and vias (e.g., vias 322b), in a way similar to the connection of the conductive lines 116 by the conductive bars 118 and the vias 122 in FIG. 3A. In other words, the conductive lines in a same layer (e.g., the conductive lines 316b) are connected one by one zigzaggedly from a top view by the conductive bars (e.g., conductive bars 318b) and the vias (e.g., vias 322b). In embodiments, two of the conductive lines in a same layer (e.g., the conductive lines 316b) are connected by multiple vias and conductive bars (e.g., three of the conductive bars 318b and six of the vias 322b) at their end portions. The number of the vias and conductive bars connecting two conductive lines in a same layer (e.g., the conductive lines 316b) may be any suitable numbers, such as one set (i.e., one conductive bar and two vias), two sets, three sets, etc. In some embodiments, the number of the sets is equal to or greater than three to ensure that connections of the two conductive lines can tolerate manufacturing process variations and withstand electromigration during operation of the semiconductor structure 100. In embodiments, the conductive bars and vias have similar dimensions, direction, materials, relative position to the conductive lines, and structure as the conductive bars 118 and vias 122 in FIG. 3A.

As described above, the conductive lines 316a-316e are zigzaggedly connected. The conductive lines 316a-316e in any single layer provide two end portions, referred to as "layer-end portions," which are shown as dashed rectangles in FIGS. 5A-5B. In FIG. 5B, 316a-316e each represents all the conductive lines in the respective layer, and the conductive lines 316a-316e in vertically adjacent layers are connected at their respective layer-end portions by the vias 322a-322e. The respective layer-end portions of the conductive lines 316a-316e in vertically adjacent layers may overlap from a top view, where the vias 322a-322e are located to connect the respective layer-end portions. The vias 322a-322e connecting two adjacent layers of the conductive lines 316a-316e may include any suitable number of vias, such as three or more vias. Further, the layer-end portions include a first end 330 and a second end 335 as shown in FIG. 5B. In an embodiment, the first end 330 is provided at a lowest layer (e.g., the layer having the conductive lines 316a) of the multiple layers of the conductive lines, and the second end 335 is provided at a highest layer (e.g., the layer having the conductive lines 316e) of the multiple layers of the conductive lines. In an alternative embodiment, the second end 335 is provided at a lowest layer (e.g., the layer having the conductive lines 316a) of the multiple layers of the conductive lines, and the first end 330 is provided at a highest layer (e.g., the layer having the conductive lines 316e) of the multiple layers of the conductive lines. In some embodiments, the first end 330 and the second end 335 are electrically coupled to the current source 120 and the voltage monitor 125. In some embodiments, the first end 330 and the second end 335 are electrically coupled to external connectors (e.g., by the conductive pads 170), such as two external connectors.

FIGS. 5C-1, 5C-2, 5C-3, and 5C-4 are partial, cross-sectional views of the semiconductor structure 100 along the G-G' line, H-H' line, I-I' line, and G-G' line of FIG. 5A according to some embodiments, respectively. Compared to FIG. 5C-1, FIG. 5C-4 shows an additional layer of conductive lines 316d over the conductive lines 316c. In embodiments, the bold arrows show current directions in the conductive lines 316b-316d during operation of the semiconductor structure 100. The dashed arrows in FIGS. 5C-3 and 5C-4 show current transmission directions from the conductive line 316b to the conductive line 316c via the vias 322c, and from the conductive line 316c to the conductive line 316d via the vias 322d, respectively. As more layers of the conductive lines and more layers of conductive bars and vias may be included in the conductive structure 315, the current goes on to more layers of the conductive lines and more layers of conductive bars and vias.

Figure 5D:
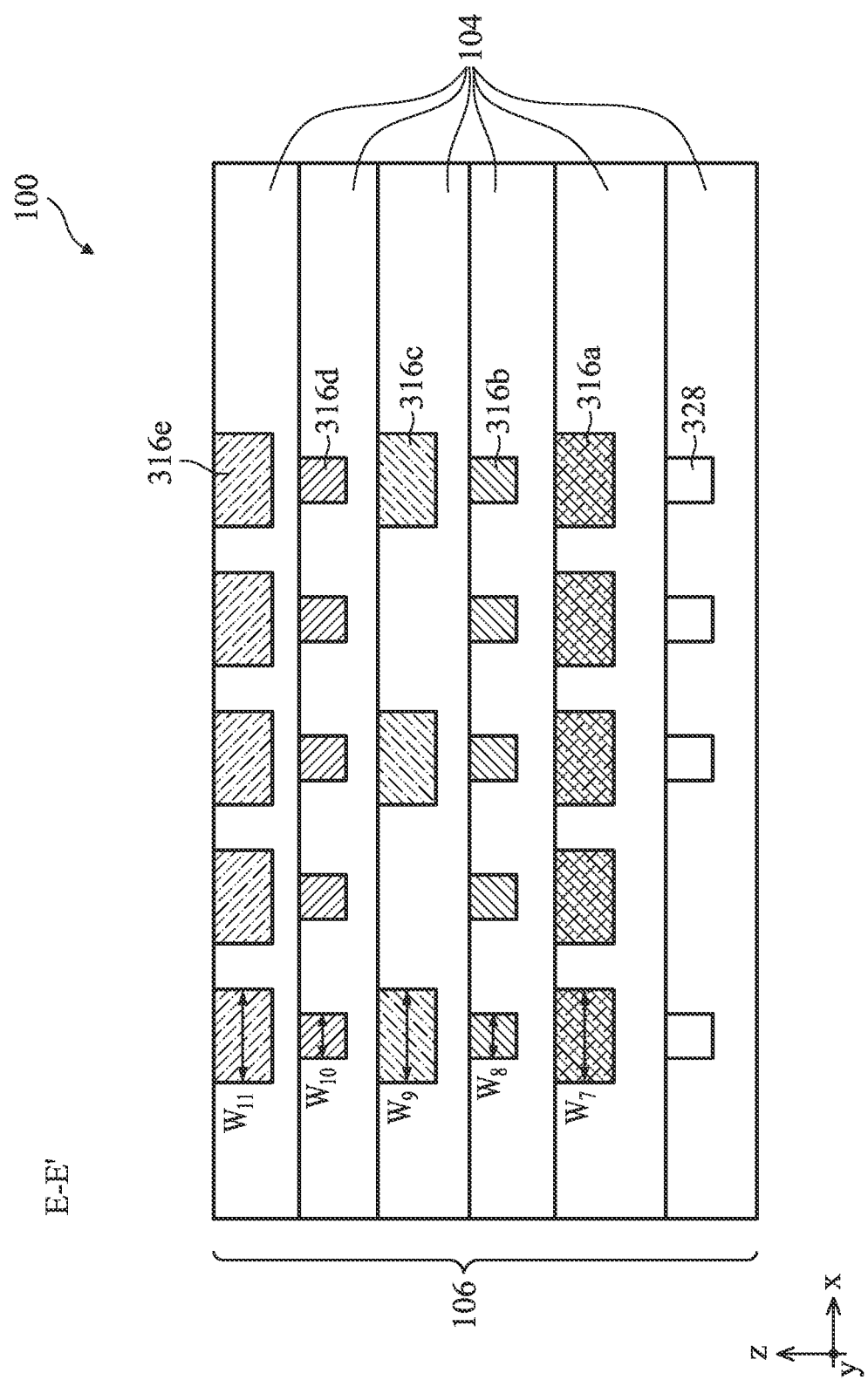

In embodiments, the conductive lines 316a-316e have similar or same dimension ranges (e.g., ranges of widths, lengths, heights, spacing, ratio of width/spacing), routing direction, materials, and structure as the conductive lines 116 in FIG. 3A. FIG. 5D is a partial, cross-sectional view of the semiconductor structure 100 along the E-E' line of FIG. 5A. Referring to FIG. 5D, the conductive lines 316a-316e are embedded in the multiple dielectric layers 104. In embodiments, the semiconductor structure 100 includes metal lines (e.g., metal lines 328) that are not a part of the conductive structure 315. In embodiments, the conductive lines 316a-316e in different layers have different widths and lateral spacing between adjacent conductive lines. In some embodiments, the multiple layers of the conductive lines include adjacent layers of conductive lines 316a, 316b, 316c, 316d, and 316e. In some embodiments, the conductive lines 316a, 316b, 316c, 316d, and 316e are in metal layers of $M_{x-1}$, $M_x$, $M_{x+1}$, $M_{x+2}$, and $M_{x+3}$, respectively (x is an integer, such as 3). The conductive lines 316a, 316b, 316c, 316d, and 316e have widths $W_7$, $W_8$, $W_9$, $W_{10}$, and $W_{11}$ in the X-direction, respectively. In some embodiments, $W_7$, $W_9$, and $W_{11}$ are greater than $W_8$ and $W_{10}$. This helps ensure an overlap in a top view of the respective layer-end portions of the conductive lines in vertically adjacent layers, which helps ensure a reliable connection between the conductive lines in vertically adjacent layers, which in turn may reduce impact by overlay shift from various manufacturing processes, such as lithography. Metal lines (not shown) that are not a part of the conductive structure 315 in the same layers as the conductive lines 316a, 316c, and 316e extend longitudinally along the X-direction, which is perpendicular to the conductive lines 316a, 316c, and 316c. Since the conductive lines 316a, 316c, and 316e run perpendicular to the majority of the metal lines in the respective layer, and the extra width of the conductive lines 316a, 316c, and 316e help ensure a reliable pattern transfer for these conductive lines during lithography. This is another reason why $W_7$, $W_9$, and $W_{11}$ are designed to be greater than $W_8$ and $W_{10}$, respectively. Metal lines (not shown) that are not a part of the conductive structure 315 in the layer of the conductive lines 316b and 316d extend longitudinally along the Y-direction (i.e., into the page of FIG. 5D), which is the same as the conductive lines 316b and 316d. In some embodiments, the conductive lines 316b are in $M_3$ metal layer. In such embodiments, the conductive lines 316a, 316c, 316d, and 316e are in metal layers of $M_2$, $M_4$, $M_5$, and $M_6$, respectively. In some embodiments, widths of each conductive lines in an even numbered metal layer (e.g., $M_0$, $M_2$, $M_4$, $M_6$, etc.) are greater than about 60 nm, such as about 60 nm to about 250 nm, about 60 nm to about 180 nm, or about 60 nm to about 100 nm.

Figure 5E:
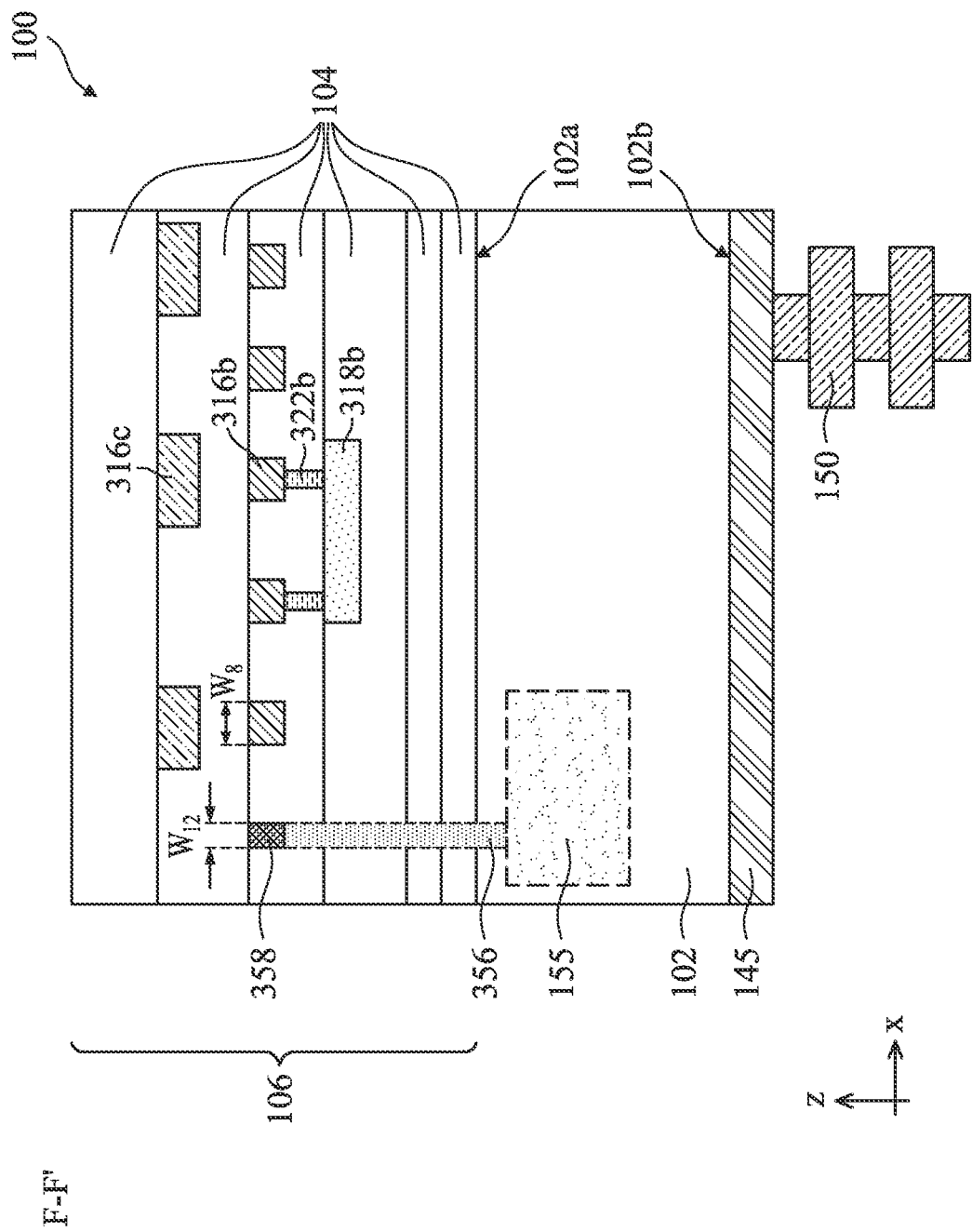

FIG. 5E is a partial, cross-sectional view of the semiconductor structure 100 along the F-F' line of FIG. 5A. Similar to FIG. 5A, the conductive lines 316a and 316d-316e are not depicted in FIG. 5E. However, more layers of conductive lines and more layers of conductive bars and vias may be included in the conductive structure 315. In some embodiments, the semiconductor structure 100 includes an interconnect metal line 358 embedded in a dielectric layer 104 where the conductive lines 316b is embedded. In such embodiments, the interconnect metal line 358 and the conductive lines 316b are in a same metal layer (e.g., $M_1$, $M_2$, $M_3$, etc.). The interconnect metal line 358 may be coupled to the one or more transistors 155 by an interconnect via 356. The interconnect metal line 358 may have a width $W_{12}$ in the X-direction. The conductive lines 316b each may have the width $W_8$. In embodiments, $W_8$ is about 2 to about 3 times of $W_{12}$. If a ratio of $W_8$ to $W_{12}$ is too small (e.g., $W_8$ is the same as $W_{12}$), variation of temperature coefficients of the resistance of the thermal sensor 315 may be increased, which may reduce accuracy of temperature measurement by the thermal sensor 315. If $W_8$ is too large (e.g., $W_8$ is 5 times of $W_{12}$), the resistance value of the thermal sensor 315 may be too small to function as a thermal sensor, and the chip footprint and the costs associated therewith may be unnecessarily increased.

The resistance R or the reference resistance $R_{T0}$ is between the first end 330 and the second end 335 of the conductive structure 315, and the current I and the voltage V are across the first end 330 and the second end 335. Similar to the thermal sensor (conductive structure) 115 in FIG. 3A, $R/R_{T0}$ of the thermal sensor (conductive structure) 315 is approximately equal to $(1+TC1*(T-T0)+TC2*(T-T0)^2)$, and the temperature T can be calculated from equation (1) during operation of the semiconductor structure 100. In various embodiments, 1σ/mean of TC1 for the thermal sensor 315 is less than about 3%, such as less than about 2.5%, less than about 1.25%, or less than about 0.75%.

For conductive structures with a same resistance R and similar dimensions of conductive lines, a multi-layer thermal sensor (e.g., the conductive structure 315) may result in a smaller width $W_1$ (thus a smaller footprint of the semiconductor structure 100) than a single layer thermal sensor (e.g., the conductive structure 115), because the conductive lines are disposed in multiple layers in the multi-layer thermal sensor. Further, the 1σ/mean of TC1 for the multi-layer thermal sensor 315 may be less than that for the single layer thermal sensor 115, thus providing a better manufacturing uniformity and more accurate temperature measurement.

Figure 6:
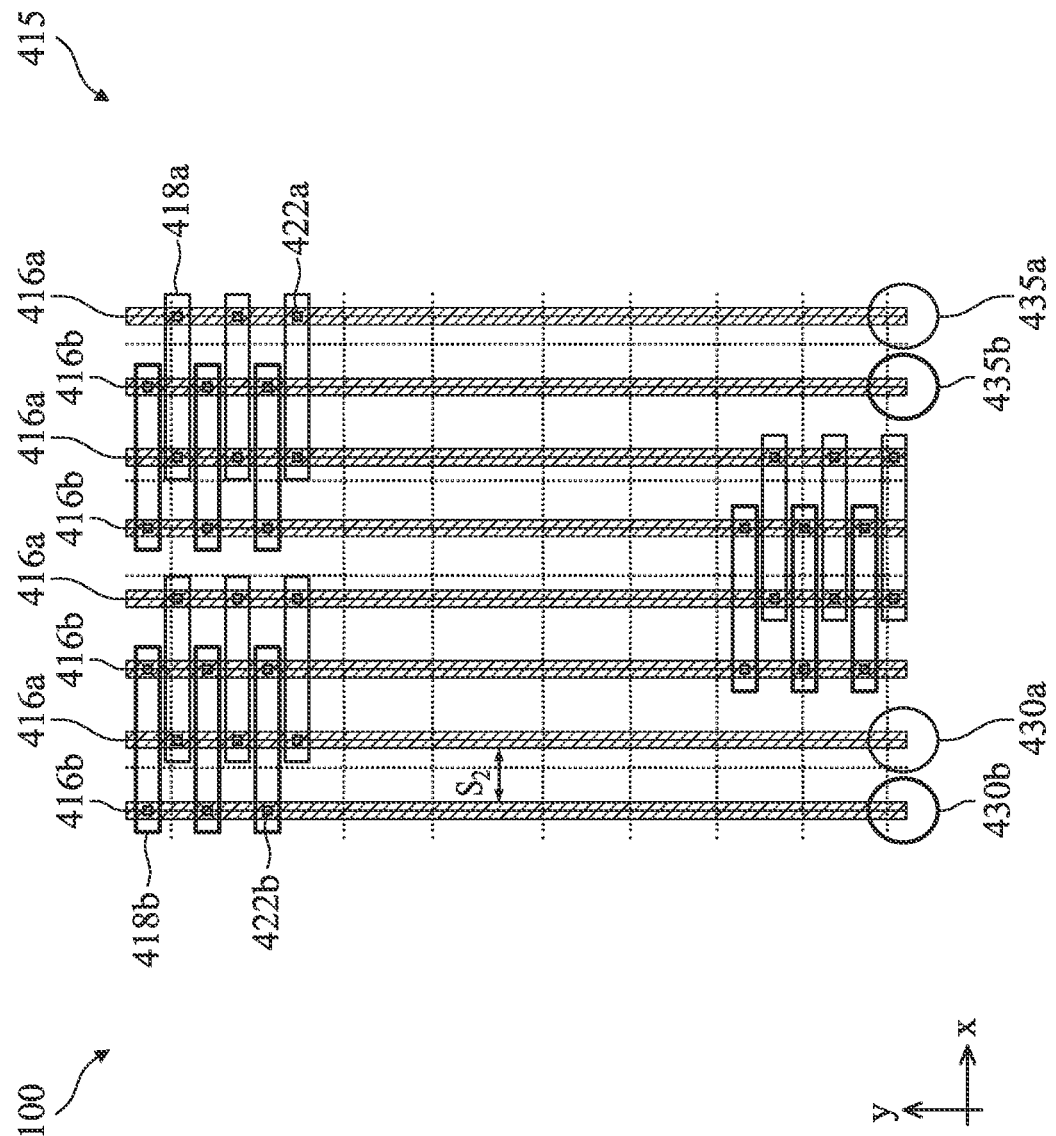

Referring to FIG. 6, in some embodiments, the semiconductor structure 100 includes a conductive structure 415 embedded in the thermal sensor region 105. The conductive structure 415 includes two sets of zigzaggedly connected conductive lines 416a and 416b, conductive bars 418a and 418b, and vias 422a and 422b. In an embodiment, the conductive lines 416a and 416b have similar or same dimensions (lengths, widths, spacing, heights, ratio of width/spacing, etc.), routing direction, materials, and structure as the conductive lines 116 in FIG. 3A. A spacing $S_2$ is the distance between two adjacent conductive lines as shown in FIG. 6 and has similar or same dimension as the spacing $S_1$ in FIG. 3A. The conductive lines 416a and 416b may be embedded in a same dielectric layer 104 or in different dielectric layers 104 (not shown in FIG. 6 for the purposes of simplicity). The conductive lines 416a are connected one by one zigzaggedly from a top view by conductive bars 418a and vias 422a. The conductive lines 416b are connected one by one zigzaggedly from a top view by conductive bars 418b and vias 422b. The set of conductive lines 416a includes a first end 430a and a second end 435a. The set of conductive lines 416b includes a third end 430b and a fourth end 435b. In some embodiments, the first end 430a and the second end 435a are electrically coupled to the current source 120 and the voltage monitor 125, and the third end 430b and the fourth end 435b are electrically coupled to a second current source and a second voltage monitor (not shown) in the substrate 102. In some embodiments, the first end 430a, the second end 435a, the third end 430b, the fourth end 435b, or combinations thereof are electrically coupled to the external connectors (e.g., by the conductive pads 170).

In an embodiment, the conductive bars 418a and 418b are in a same layer and are parallel to each other such as shown in FIG. 6. In some embodiments, the conductive bars 418a and 418b are in different layers and in a top view the conductive bars 418a and 418b may have overlap.

In embodiments, for the two sets of the conductive lines 416a and the conductive lines 416b, a first resistance R1 between the first end 430a and the second end 435a and a second resistance R2 between the third end 430b and the fourth end 435b are measured during operation of the semiconductor structure 100, as discussed above for the conductive structures 115 and 315. For example, two temperatures T1 and T2 may be calculated by equation (1) for the two sets of the conductive lines 416a and 416b, respectively. A difference between T1 and T2 may reflect process variations (e.g., thickness or other dimensions of various parts) in small areas. For example, T1 and T2 may be temperatures of adjacent transistors, and the difference between T1 and T2 may reflect a difference between critical dimensions (e.g., thickness of a dielectric feature) of the adjacent transistors.

Although only two sets of the conductive lines 416a and 416b are depicted in FIG. 6, the semiconductor structure 100 may include more than two sets of conductive lines. Each set of the conductive lines are connected one by one zigzaggedly from a top view by conductive bars and vias. Different sets of the conductive lines may be embedded in a same dielectric layer 104 or in different dielectric layers 104. Each set of the conductive lines may result in one thermal sensor.

The semiconductor structure 100 may include any number of single layer thermal sensors (e.g., the conductive structure 115), any number of multi-layer thermal sensors (e.g., the conductive structure 315), any number of thermal sensors with multiple sets of conductive lines (e.g., the conductive structure 415), or any combinations thereof. In embodiments, the thermal sensors (or each set of the conductive lines) are embedded in the thermal sensor region 105. Each of the thermal sensors (or each set of the conductive lines) may be electrically coupled to a current source and a voltage monitor, and/or external connectors. In embodiments, the semiconductor structure 100 having more than one conductive structure may include more than one current source and more than one voltage monitor electrically coupled to the conductive structures.

Although not intended to be limiting, one or more embodiments of the present disclosure provide many benefits to a semiconductor device and the formation thereof. For example, embodiments of the present disclosure provide a semiconductor structure with a conductive structure in various configurations. A resistance of the conductive structure may be measured, so that a temperature of the semiconductor structure may be calculated. The temperature coefficient TC1 has relatively small variations. The semiconductor structure may be manufactured using any suitable methods and may be adapted to various types of ICs.

In one exemplary aspect, the present disclosure is directed to a semiconductor structure including a substrate having a front side and a back side opposite to the front side, one or more dielectric layers over the front side of the substrate, and a conductive structure. The one or more dielectric layers includes a thermal sensor region and two dummy regions sandwiching the thermal sensor region along a second direction from a top view, and the thermal sensor region and the two dummy regions extend longitudinally along a first direction generally perpendicular to the second direction from the top view. The conductive structure is embedded in the thermal sensor region of the one or more dielectric layers. The conductive structure includes conductive lines parallel to each other and extending longitudinally along the first direction, and conductive bars and vias electrically connecting the conductive lines. The conductive lines in a same dielectric layer of the one or more dielectric layers are electrically connected one by one zigzaggedly from the top view. In some embodiments, the conductive bars extend longitudinally along the second direction. In some embodiments, a ratio of a total width of the two dummy regions to a width of the thermal sensor region along the second direction is about 0.8 to about 10. In some embodiments, a ratio of a width of each of the conductive lines to a spacing between adjacent two of the conductive lines along the second direction is about 0.2 to about 5. In some embodiments, the conductive structure includes a first end and a second end separated from the first end, and a resistance between the first and the second ends at 25 degree Celsius is about 10,000 ohm to about 20,000 ohm. In some embodiments, the substrate includes a current source and a voltage monitor, the conductive structure includes a first end and a second end separated from the first end, and the first and the second ends being coupled to the current source and the voltage monitor. In some embodiments, the semiconductor structure further includes two external connectors, and the conductive structure includes a first end and a second end separated from the first end, the first and the second ends being coupled to the two external connectors. In some embodiments, the semiconductor structure further includes a backside interconnect on the back side of the substrate. In some embodiments, the conductive structure includes a first end and a second end separated from the first end, a resistance between the first and the second ends at a temperature T is R, a reference resistance between the first and the second ends at a reference temperature T0 is $R_{T0}$, $R/R_{T0}$ is approximately equal to $(1+TC1*(T-T0)+TC2*(T-T0)^2)$, and 1σ/mean of TC1 is less than about 3%.

In another exemplary aspect, the present disclosure is directed to a semiconductor structure including a substrate having a front side and a back side opposite to the front side, one or more dielectric layers over the front side of the substrate, and a conductive structure. The one or more dielectric layers includes a thermal sensor region and two dummy regions sandwiching the thermal sensor region along a second direction, and the thermal sensor region and two dummy regions extend longitudinally along a first direction generally perpendicular to the second direction. The conductive structure is embedded in the thermal sensor region of the one or more dielectric layers. The conductive structure includes multi-layers of conductive lines parallel to each other and extending longitudinally along the first direction, and conductive bars and vias electrically connecting the conductive lines. A first conductive line in a first layer of the multi-layers is electrically connected to a second conductive line in a second layer of the multi-layers adjacent to the first layer by the vias. The conductive lines in a same layer of the multi-layers are electrically connected one by one zigzaggedly from a top view by the conductive bars and the vias. A first end of the conductive structure is provided at a lowest layer of the multi-layers and a second end of the conductive structure is provided at a highest layer of the multi-layers. In some embodiments, the conductive bars and the conductive lines in a same layer of the multi-layers are oriented lengthwise perpendicular to one another. In some embodiments, the multi-layers include adjacent layers $M_{x-1}$, $M_x$, and $M_{x+1}$ from bottom to top, wherein a width $W_{x-1}$ of each of the conductive lines in the layer $M_{x-1}$ is greater than a width $W_x$ of each of the conductive lines in the layer $M_x$, and $W_x$ is less than a width $W_{x+1}$ of each of the conductive lines in the layer $M_{x+1}$, and wherein $W_{x-1}$, $W_x$, and $W_{x+1}$ are measured along the second direction. In some embodiments, x is 3. In some embodiments, the substrate includes a current source and a voltage monitor, and the first and the second ends of the conductive structure are coupled to the current source and the voltage monitor. In some embodiments, a resistance between the first and the second ends of the conductive structure at a temperature T is R, a reference resistance between the first and the second ends at a reference temperature T0 is $R_{T0}$, $R/R_{T0}$ is approximately equal to $(1+TC1*(T-T0)+TC2*(T-T0)^2)$, and 1σ/mean of TC1 is less than about 2.5%.

In another exemplary aspect, the present disclosure is directed to a semiconductor structure including a substrate having a front side and a back side opposite to the front side, a first dielectric layer over the front side of the substrate, conductive lines, a second dielectric layer adjacent the first dielectric layer, conductive bars embedded in the second dielectric layer, and conductive vias vertically connecting the conductive bars to the conductive lines. The first dielectric layer includes a thermal sensor region and two dummy regions sandwiching the thermal sensor region along a second direction, and the thermal sensor region and the two dummy regions extend longitudinally along a first direction generally perpendicular to the second direction from a top view. The conductive lines are embedded in the thermal sensor region of the first dielectric layer, parallel to each other, and extend longitudinally along the first direction. The conductive bars extend longitudinally along the second direction. The conductive lines are electrically connected one by one zigzaggedly by the conductive bars and the conductive vias from a top view. In some embodiments, a width of each of the conductive lines along the second direction is about 18 nm to about 100 nm. In some embodiments, the substrate includes transistors, the semiconductor structure further includes a metal line in the first dielectric layer and connected to the transistors, and a second width $W_2$ of each of the conductive lines is about 2 times to about 3 times of a first width $W_1$ of the metal line, $W_1$ and $W_2$ being dimensions along the second direction. In some embodiments, the semiconductor structure further includes dummy conductive lines embedded in each of the two dummy regions, and the dummy conductive lines are parallel to each other and extending longitudinally along the first direction. In some embodiments, the semiconductor structure further includes two external connectors, the conductive lines include a first end and a second end separated from the first end, and the first and the second ends are coupled to the two external connectors.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having a front side and a back side opposite to the front side;
one or more dielectric layers over the front side of the substrate, the one or more dielectric layers including a thermal sensor region and two dummy regions sandwiching the thermal sensor region along a second direction from a top view, the thermal sensor region and the two dummy regions extending longitudinally along a first direction generally perpendicular to the second direction from the top view; and
a conductive structure embedded in the thermal sensor region of the one or more dielectric layers,
wherein the conductive structure includes conductive lines parallel to each other and extending longitudinally along the first direction, and conductive bars and vias electrically connecting the conductive lines, and
wherein the conductive lines in a same dielectric layer of the one or more dielectric layers are electrically connected one by one zigzaggedly from the top view.

2. The semiconductor structure of claim 1, wherein the conductive bars extend longitudinally along the second direction.

3. The semiconductor structure of claim 1, wherein a ratio of a total width of the two dummy regions to a width of the thermal sensor region along the second direction is about 0.8 to about 10.

4. The semiconductor structure of claim 1, wherein a ratio of a width of each of the conductive lines to a spacing between adjacent two of the conductive lines along the second direction is about 0.2 to about 5.

5. The semiconductor structure of claim 1, wherein the conductive structure includes a first end and a second end separated from the first end,
wherein a resistance between the first and the second ends at 25 degree Celsius is about 10,000 ohm to about 20,000 ohm.

6. The semiconductor structure of claim 1, wherein the substrate includes a current source and a voltage monitor, and
wherein the conductive structure includes a first end and a second end separated from the first end, the first and the second ends being coupled to the current source and the voltage monitor.

7. The semiconductor structure of claim 1, further comprising two external connectors,
wherein the conductive structure includes a first end and a second end separated from the first end, the first and the second ends being coupled to the two external connectors.

8. The semiconductor structure of claim 1, further comprising a backside interconnect on the back side of the substrate.

9. The semiconductor structure of claim 1, wherein the conductive structure includes a first end and a second end separated from the first end,
wherein a resistance between the first and the second ends at a temperature T is R, a reference resistance between the first and the second ends at a reference temperature T0 is $R_{T0}$,
wherein $R/R_{T0}$ is approximately equal to $(1+TC1*(T-T0)+TC2*(T-T0)^2)$,
wherein 1σ/mean of TC1 is less than about 3%.

10. A semiconductor structure, comprising:
a substrate having a front side and a back side opposite to the front side;
one or more dielectric layers over the front side of the substrate, the one or more dielectric layers including a thermal sensor region and two dummy regions sandwiching the thermal sensor region along a second direction, the thermal sensor region and two dummy regions extending longitudinally along a first direction generally perpendicular to the second direction; and
a conductive structure embedded in the thermal sensor region of the one or more dielectric layers,
wherein the conductive structure includes multi-layers of conductive lines parallel to each other and extending longitudinally along the first direction, and conductive bars and vias electrically connecting the conductive lines,
wherein a first conductive line in a first layer of the multi-layers is electrically connected to a second conductive line in a second layer of the multi-layers adjacent to the first layer by the vias,
wherein the conductive lines in a same layer of the multi-layers are electrically connected one by one zigzaggedly from a top view by the conductive bars and the vias, and
wherein a first end of the conductive structure is provided at a lowest layer of the multi-layers and a second end of the conductive structure is provided at a highest layer of the multi-layers.

11. The semiconductor structure of claim 10, wherein the conductive bars and the conductive lines in a same layer of the multi-layers are oriented lengthwise perpendicular to one another.

12. The semiconductor structure of claim 10, wherein the multi-layers include adjacent layers $M_{x-1}$, $M_x$, and $M_{x+1}$ from bottom to top, wherein a width $W_{x-1}$ of each of the conductive lines in the layer $M_{x-1}$ is greater than a width $W_x$ of each of the conductive lines in the layer $M_x$, and $W_x$ is less than a width $W_{x+1}$ of each of the conductive lines in the layer $M_{x+1}$, and wherein $W_{x-1}$, $W_x$, and $W_{x+1}$ are measured along the second direction.

13. The semiconductor structure of claim 12, wherein x is 3.

14. The semiconductor structure of claim 10, wherein the substrate includes a current source and a voltage monitor, and
wherein the first and the second ends of the conductive structure are coupled to the current source and the voltage monitor.

15. The semiconductor structure of claim 10, wherein a resistance between the first and the second ends of the conductive structure at a temperature T is R, a reference resistance between the first and the second ends at a reference temperature T0 is $R_{T0}$,
wherein $R/R_{T0}$ is approximately equal to $(1+TC1*(T-T0)+TC2*(T-T0)^2)$, wherein 1σ/mean of TC1 is less than about 2.5%.

16. A semiconductor structure, comprising:
a substrate having a front side and a back side opposite to the front side;
a first dielectric layer over the front side of the substrate, the first dielectric layer including a thermal sensor region and two dummy regions sandwiching the thermal sensor region along a second direction, the thermal sensor region and the two dummy regions extending longitudinally along a first direction generally perpendicular to the second direction from a top view;
conductive lines embedded in the thermal sensor region of the first dielectric layer, parallel to each other, and extending longitudinally along the first direction;
a second dielectric layer adjacent the first dielectric layer;
conductive bars embedded in the second dielectric layer, the conductive bars extending longitudinally along the second direction; and
conductive vias vertically connecting the conductive bars to the conductive lines, wherein the conductive lines are electrically connected one by one zigzaggedly by the conductive bars and the conductive vias from the top view.

17. The semiconductor structure of claim 16, wherein a width of each of the conductive lines along the second direction is about 18 nm to about 100 nm.

18. The semiconductor structure of claim 16, wherein the substrate includes transistors, the semiconductor structure further comprising a metal line in the first dielectric layer and connected to the transistors,
wherein a second width $W_2$ of each of the conductive lines is about 2 times to about 3 times of a first width $W_1$ of the metal line, $W_1$ and $W_2$ being dimensions along the second direction.

19. The semiconductor structure of claim 16, further comprising dummy conductive lines embedded in each of the two dummy regions,
wherein the dummy conductive lines are parallel to each other and extending longitudinally along the first direction.

20. The semiconductor structure of claim 16, further comprising two external connectors,
wherein the conductive lines include a first end and a second end separated from the first end, the first and the second ends being coupled to the two external connectors.

* * * * *